(12) United States Patent
Nakano

(10) Patent No.: US 10,924,103 B2
(45) Date of Patent: Feb. 16, 2021

(54) DRIVER CIRCUITRY

(71) Applicants: Kabushiki Kaisha Toshiba, Tokyo (JP); Toshiba Electronic Devices & Storage Corporation, Tokyo (JP)

(72) Inventor: Kenichi Nakano, Yokohama Kanagawa (JP)

(73) Assignees: Kabushiki Kaisha Toshiba, Tokyo (JP); Toshiba Electronic Devices & Storage Corporation, Tokyo (JP)

(*) Notice: Subject to any disclaimer, the term of this patent is extended or adjusted under 35 U.S.C. 154(b) by 0 days.

(21) Appl. No.: 16/790,381

(22) Filed: Feb. 13, 2020

(65) Prior Publication Data
US 2020/0403609 A1 Dec. 24, 2020

(30) Foreign Application Priority Data
Jun. 24, 2019 (JP) .............................. JP2019-116636

(51) Int. Cl.
 *H03K 17/082* (2006.01)
(52) U.S. Cl.
 CPC ............................... *H03K 17/0822* (2013.01)
(58) Field of Classification Search
 CPC ..................... H03K 17/082; H03K 17/0822
 See application file for complete search history.

(56) References Cited

U.S. PATENT DOCUMENTS

| | | | |
|---|---|---|---|
| 7,579,900 B2 | 8/2009 | Durbaum | |
| 9,461,638 B2* | 10/2016 | Miyauchi | ............... H03K 17/14 |
| 2005/0162216 A1* | 7/2005 | Ueda | ................. H03K 17/0826 |
| | | | 327/540 |
| 2011/0242861 A1 | 10/2011 | Ayukawa et al. | |
| 2019/0158083 A1* | 5/2019 | Horiguchi | ............ H03K 17/165 |

FOREIGN PATENT DOCUMENTS

| | | |
|---|---|---|
| JP | 2007-502569 A | 2/2007 |
| JP | 2011-217427 A | 10/2011 |
| NL | 2020745 A | 10/2018 |
| WO | 2018-198211 A1 | 11/2018 |

* cited by examiner

*Primary Examiner* — Diana J. Cheng
(74) *Attorney, Agent, or Firm* — White & Case LLP

(57) ABSTRACT

A driver circuitry includes a voltage application circuitry, a current detection circuitry, and a control circuitry. The voltage application circuitry is connected to a drive terminal of a transistor, and controls a voltage of an input signal and applies to the drive terminal. The current detection circuitry is connected to an output terminal of the transistor, and detects that a current output from the transistor becomes a size of a predetermined current or more. The control circuitry is connected to the current detection circuitry, and controls the voltage application circuitry based on the voltage of the input signal to output a voltage between the drive terminal and the output terminal at the timing when the current detection circuitry detects the current of the predetermined current or more.

8 Claims, 5 Drawing Sheets

DRIVER CIRCUITRY

CROSS REFERENCE TO RELATED APPLICATIONS

This application is based upon and claims the benefit of priority from the prior Japanese Patent Application No. 2019-116636, filed on Jun. 24, 2019, the entire contents of which are incorporated herein by reference.

FIELD

The embodiments of the present invention relate to a driver circuitry.

BACKGROUND

In a power MOSFET (metal-oxide-semiconductor field-effect-transistor), thermal runaway is unlikely to occur and parallel connection is generally easy compared to a bipolar transistor or the like. When the power MOSFET is used with large current, it is therefore often used in parallel connection to improve energization current capability. However, there is a predetermined range in a threshold voltage Vth in transistors forming a power device due to individual differences resulting from wafer process, manufacturing variance, and the like.

When one threshold voltage Vth is enough lower than the other threshold voltage Vth among the transistors connected in parallel, there is a possibility that a drain current generated at the transistor whose Vth is lower becomes large at the timing of turning on to exceed a maximum rated current of a device. That is, unbalance in current due to variation in Vth occurs to cause a probability that the power device is broken due to overstress in some cases.

DETAILED DESCRIPTION

According to one embodiment, a driver circuitry includes a voltage application circuitry, a current detection circuitry, and a control circuitry. The voltage application circuitry is connected to a drive terminal of a transistor, and controls a voltage of an input signal and applies to the drive terminal. The current detection circuitry is connected to an output terminal of the transistor, and detects that a current output from the transistor becomes a size of a predetermined current or more. The control circuitry is connected to the current detection circuitry, and controls the voltage application circuitry based on the voltage of the input signal to output a voltage between the drive terminal and the output terminal at the timing when the current detection circuitry detects the current of the predetermined current or more.

Embodiments will now be explained with reference to the accompanying drawings. In the following drawings, voltages Vdd, Vss to be references are illustrated, and paths through which these voltages are applied are properly supplied at a location where a circuit element is required in addition to explicitly illustrated paths. For example, in FIG. 2, Vdd, Vss are connected to respective comparators or the like according to need. In the following explanation, an expression of "the same timing" is used, and the expression means not the strict timing of completely at the same moment but the timing with a range which does not affect as a switching element.

Figure 1:
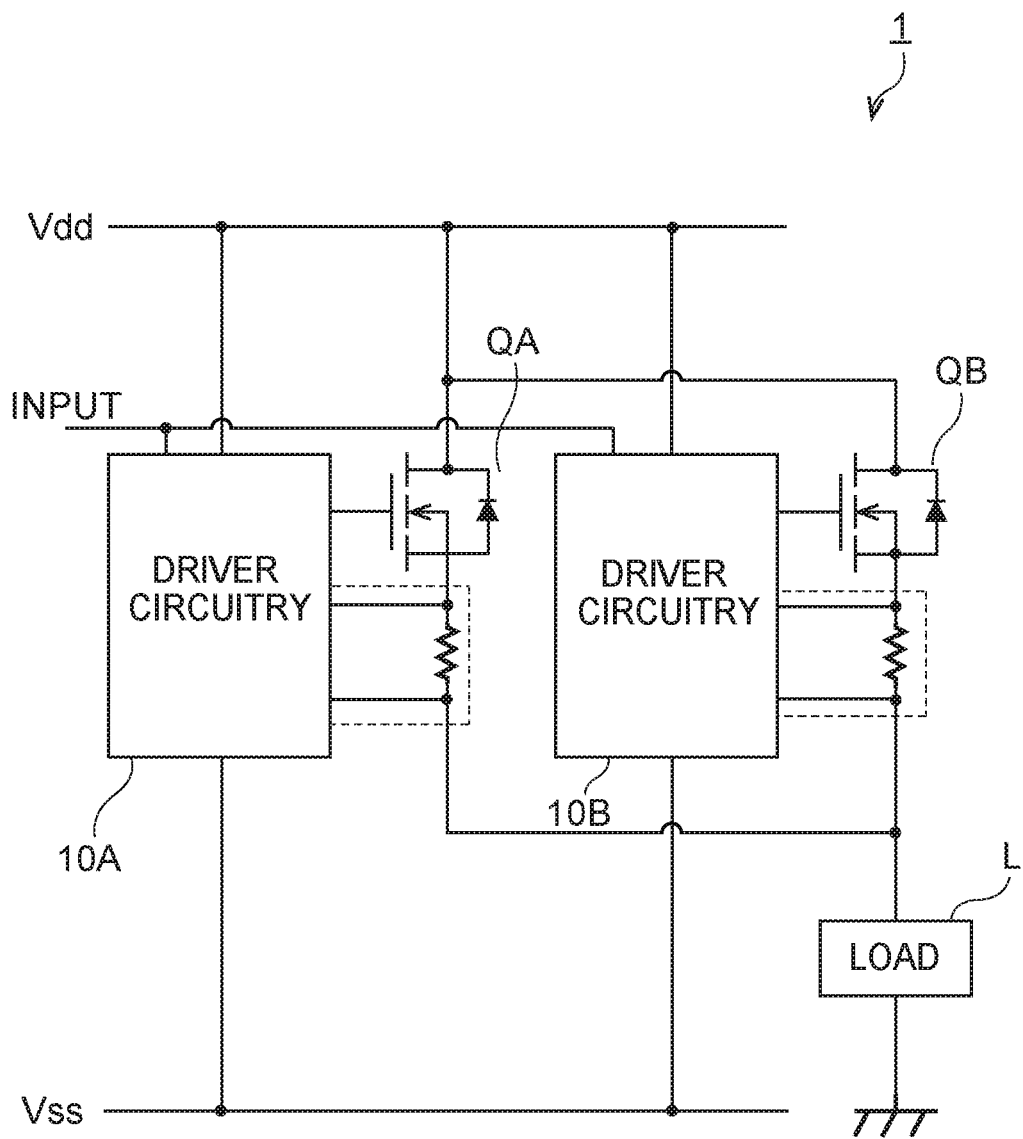
FIG. 1 is a usage example of a driver circuitry according to an embodiment.

FIG. 1 illustrates an example of an electronic circuitry including driver circuitries 10 according to an embodiment. An electronic circuitry 1 is, for example, a switching circuitry for a load L where power MOSFETs QA, QB (hereinafter, the power MOSFET is denoted just as a FET) are connected in parallel. Driver circuitries 10A, 10B are each a circuitry to drive these FETs QA, QB. Respective driver circuitries 10 control a voltage applied to a gate (a drive terminal) of each switching element to align driving timings of these FETs QA, QB.

For example, when a threshold voltage of the FET QA is lower than a threshold voltage of the FET QB and the same rising voltage is applied to gates (drive terminals) of these FETs, the FET QA precedently outputs a drain current, and then the FET QB outputs the drain current. In this embodiment, the rising voltage is controlled at the driver circuitries 10A, 10B to thereby make the drain currents of the FETs QA, QB flow at the same timing regardless of individual differences of the threshold voltages. Hereinafter, for example, the similar driver circuitry 10 forming the driver circuitries 10A, 10B is explained.

Figure 2:
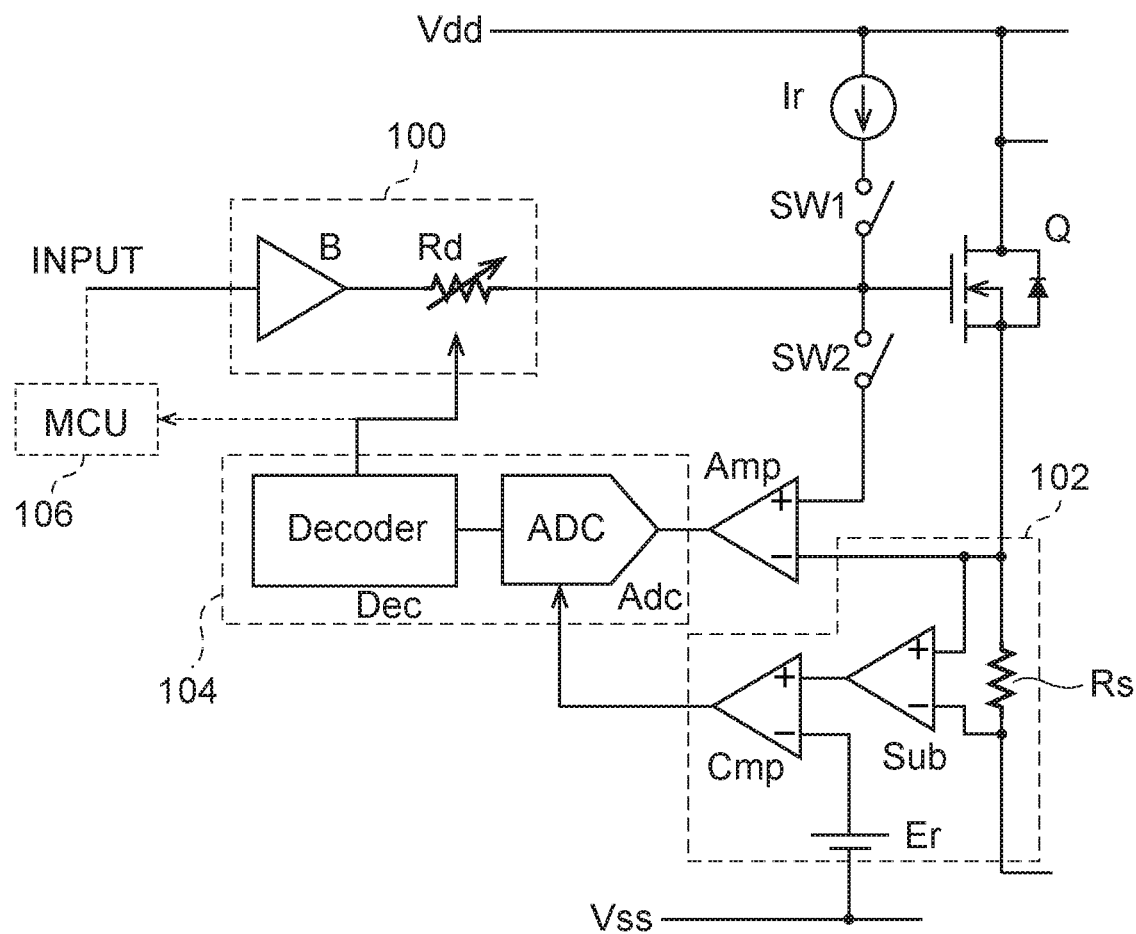
FIG. 2 is a circuit diagram of the driver circuitry according to an embodiment.

FIG. 2 illustrates an example of a circuit diagram of the driver circuitry 10 according to this embodiment. The driver circuitry 10 includes a voltage application circuitry 100, a current detection circuitry 102, and a control circuitry 104. Besides, a current source Ir, switches Sw1, Sw2, and a differential amplifier circuitry Amp are included. Further, an MCU 106 (micro controller unit) is included according to need. The MCU 106 may be commonly included among a plurality of driver circuitries 10. The MCU 106 is explained later.

The voltage application circuitry 100 is a circuitry to control a voltage of an input signal and to apply to a gate of a FET Q. The voltage application circuitry 100 is connected between an input terminal of a gate drive signal and the gate of the FET Q, and includes, for example, a buffer B and a variable resistor Rd. The voltage of the input signal is controlled by the variable resistor Rd and applied to the gate of the FET Q.

An initial value of the variable resistor Rd is adjusted to control the voltage of the input signal such that, for example, the voltage sufficiently exceeds a threshold voltage to be applied to the gate when the threshold voltage is an ideal voltage. When the threshold voltage of the connected FET Q is lower than a theoretical value, the voltage is lowered by making the resistance large to be applied to the gate of the FET Q. When the threshold voltage of the FET Q is higher than the theoretical value, the voltage is made higher than the theoretical value by making the resistance small to be applied to the gate of the FET Q. The timings of switching by respective FETs are aligned when a plurality of FETs are connected in parallel by adjusting the controlled voltage as stated above.

The current detection circuitry 102 detects that the drain current output from the FET Q becomes a predetermined current or more. The predetermined current is a value of a current flowing between a drain and a source when a voltage which is equal to the threshold voltage is applied to the gate of the FET Q and the sufficient voltage is applied to the drain. The predetermined current may not precisely be this value but may be slightly deviated up and down. The current detection circuitry 102 is connected to acquire the drain current of the FET Q and includes, for example, a resistor Rs, a subtractor circuitry Sub, a comparator circuitry Cmp, and a voltage source Er. The resistor Rs is connected in series to the drain of the FET Q. The subtractor circuitry Sub is, for example, an operational amplifier, and connected in parallel with the resistor Rs. The comparator circuitry Cmp is also, for example, an operational amplifier, and a non-inverting input terminal thereof is connected to an output of the subtractor circuitry Sub. The voltage source Er is connected to an inverting input terminal of the comparator circuitry Cmp and applies a predetermined electric potential to the inverting input terminal of the comparator circuitry Cmp.

When the predetermined current flows through the resistor Rs, a potential difference is generated between terminals of the resistor Rs. The subtractor circuitry Sub acquires this potential difference and outputs to the comparator circuitry Cmp. In the comparator circuitry Cmp, a predetermined voltage by the voltage source Er and the output from the subtractor circuitry Sub are compared, and when the output from the subtractor circuitry Sub is the predetermined voltage or more, an enable signal is output to the control circuitry 104. That is, the predetermined voltage is set as the potential difference when the predetermined current flows through the resistor Rs.

A configuration of the current detection circuitry 102 is not limited to the above as long as it is possible to properly detect that the drain current which is the predetermined current or more flows. For example, a circuitry which has a different configuration from the above configuration, acquires a current, and outputs the enable signal when the current is the predetermined current or more may be formed on the same substrate as the switching circuitry.

The control circuitry 104 receives the enable signal from the current detection circuitry 102, then controls impedance of the voltage application circuitry 100 based on the gate-source voltage of the FET Q at the timing when the enable signal is received. The control circuitry 104 is connected to the current detection circuitry 102, and includes, for example, a converter Adc, and a decoder Dec.

The converter Adc is a converter which converts an analog signal into a digital signal (ADC: analog-digital converter). The converter Adc receives an analog signal and converts the analog signal into a digital signal to output. The converter Adc converts an analog voltage being the gate-source voltage of the FET Q into a digital signal and outputs the digital signal.

The decoder Dec controls the impedance of the voltage application circuitry 100 based on the digital signal output by the converter Adc. Based on the output from the converter Adc, the decoder Dec calculates a resistance value to control the input signal to be the output value and controls the resistance value of the variable resistor Rd to be the calculated value. A through rate for the input signal is determined by controlling the resistance value. For example, the resistance value of the variable resistor Rd is set to be large to decrease the through rate when the threshold voltage of the FET is lower than the theoretical value, and the resistance value of the variable resistor Rd is set to be small to increase the through rate when the threshold voltage of the FET is higher.

The control circuitry 104 is not limited to the above-stated configuration as long as it is a circuitry capable of acquiring the variable resistance value controlling the input signal to be the received voltage. The voltage application circuitry 100 and the control circuitry 104 may each be any circuitry as long as the impedance can be controlled to be a proper value, and the above configuration is just illustrated as an example.

The driver circuitry 10 uses the included current source Ir, the first switch Sw1, the second switch Sw2, and the differential amplifier circuitry Amp to make control by calculating the resistance value.

The first switch Sw1 and the second switch Sw2 are synchronously operating switches, and for example, they are turned on when the electronic circuitry 1 is powered on and at a stage previously to supply electric power to the load L, and turned off when the control of the impedance by the control circuitry 104 is finished. Both the first switch Sw1 and the second switch Sw2 are not necessarily provided, and it may be a switch capable of switching connection of the gate of the FET Q with the current source Ir and the differential amplifier circuitry Amp.

When the first switch Sw1 and the second switch Sw2 are turned on, the gate of the FET Q is connected to the current source Ir and the differential amplifier circuitry Amp. When the current flows from the current source Jr, the electric potential of the gate of the FET Q becomes high.

In the differential amplifier circuitry Amp, a non-inverting terminal is connected to the gate of the FET Q, and an inverting terminal is connected to the source of the FET Q by turning on the second switch Sw2. That is, the differential amplifier circuitry Amp amplifies the gate-source voltage of the FET Q and outputs the voltage to the converter Adc.

When the voltage higher than the threshold voltage is applied to the gate of the FET Q by the current source Jr, the enable signal is output from the current detection circuitry 102 to the converter Adc. When the enable signal is input, the converter Adc converts the output of the differential amplifier circuitry Amp into the digital signal, and the decoder Dec controls the resistance value of the variable resistor Rd based on this conversion result.

After the control of the variable resistor Rd is completed, the first switch Sw1 and the second switch Sw2 are turned off, and a drive signal from the voltage application circuitry 100 is applied to the gate of the FET Q. A through rate of the drive signal is adjusted by controlling the impedance.

Figure 3:
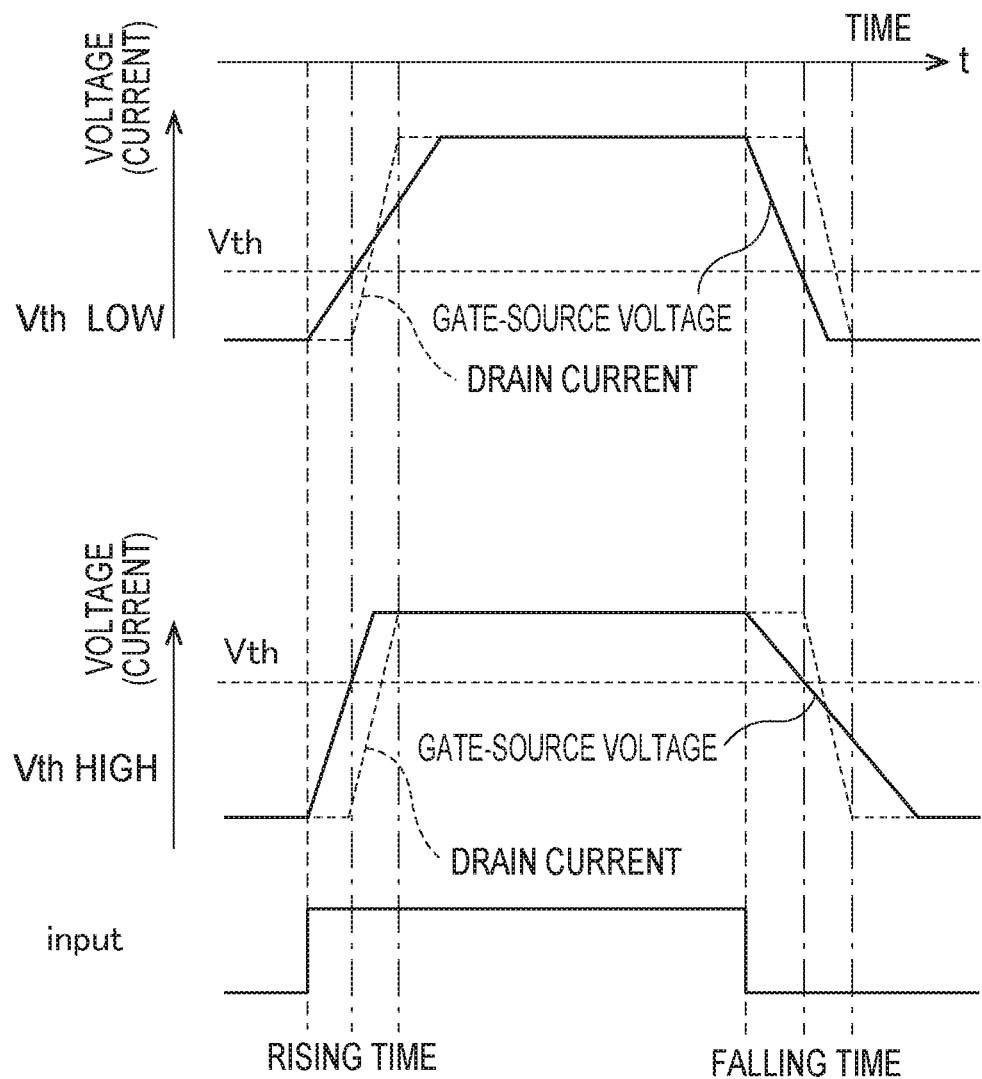
FIG. 3 is a timing chart of output of a driver circuitry according to an embodiment.

FIG. 3 is a diagram illustrating the through rates when the threshold voltages Vth are low and high. In the diagram, a solid line indicates the gate-source voltage, a dotted line indicates the drain current, and a broken line indicates the threshold voltage. A rising time and a falling time are each indicated by a dot-and-dash line to make it easier to see. The horizontal axis indicates the time and the vertical axis indicates the gate voltage (or drain current) of the FET Q.

As illustrated in FIG. 3, it becomes possible to make the rising times the same in both cases when the threshold voltages Vth are low and high. This is because the impedance of the voltage application circuitry 100 is controlled and the through rate can be changed by the threshold voltage Vth.

Figure 4:
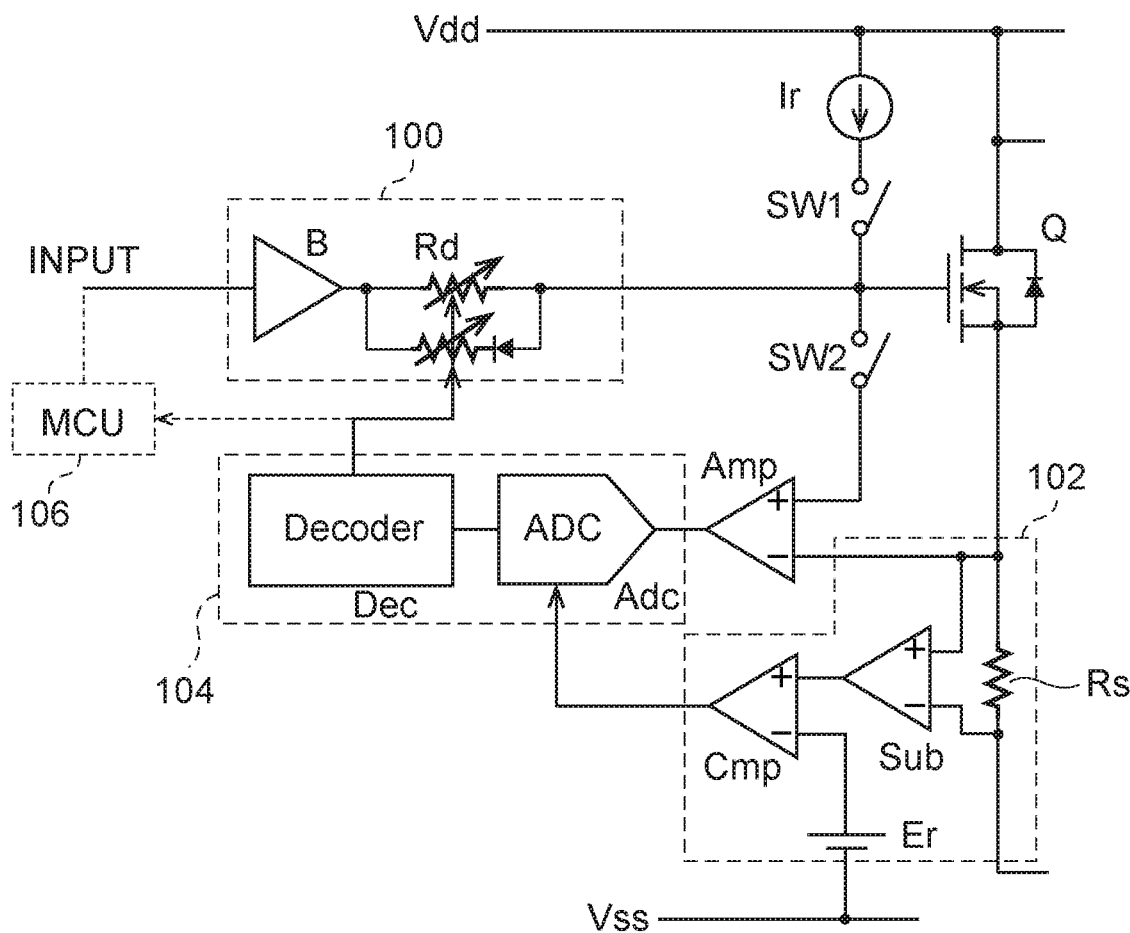
FIG. 4 is a circuit diagram of a driver circuitry according to an embodiment.

FIG. 4 is a circuit diagram of the driver circuitry 10 according to a modification example of this embodiment. This driver circuitry 10 controls the voltages not only at the timing of turning-on but also at the timing of turning-off (falling) in the voltage application circuitry 100. The voltage application circuitry 100 further includes a variable resistor for turn-off impedance adjustment and a diode which is connected in series with the variable resistor.

The variable resistor for the turn-off impedance adjustment is adjusted such that, for example, the falling time becomes the same degree as an ideal threshold voltage Vth when the voltage applied to the gate decreases after the drain current flows through the FET Q. Such a state can be measured by controlling the first switch Sw1 and the second switch Sw2. More concretely, a value of the variable resistor which is connected in series with the diode is controlled such that a through rate by a combined resistance value of the resistors included in parallel in the voltage application circuitry 100 has a falling inclination illustrated in FIG. 3.

As mentioned above, the variable resistor for turning-off may be included, and in this case, it becomes possible to align both the rising time and the falling time as illustrated in FIG. 3.

Figure 5:
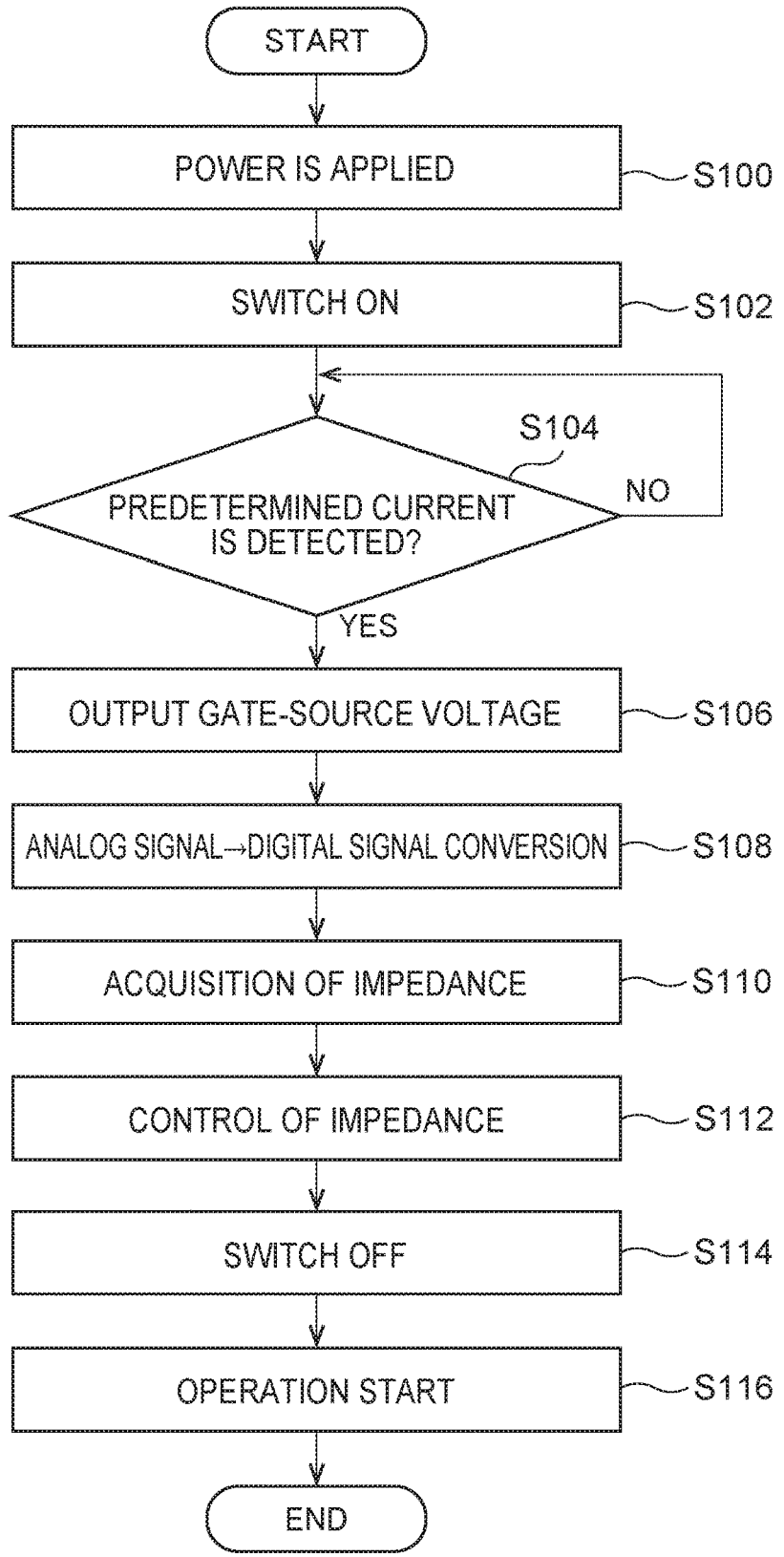
FIG. 5 is a flowchart illustrating processes of a driver circuitry according to an embodiment.

FIG. 5 is a flowchart illustrating a flow of processes of the driver circuitry 10 according to this embodiment. Operations of the driver circuitry 10 are explained by using this flowchart.

First, power is applied to the electronic circuitry 1 in FIG. 1 (S100). At this timing, the first switch Sw1 and the second switch Sw2 are each desired to be in an off-state, but they are not limited thereto.

Next, the first switch Sw1 and the second switch Sw2 are each turned into an on-state (S102). A circuitry which senses the application of the power and automatically turns each switch into the on-state may be included at the inside or outside of the driver circuitry 10. For example, a terminal from the power supply may be provided at the driver circuitry 10, and the switches may be turned on when electric power is supplied to this terminal. The current source Ir and the differential amplifier circuitry Amp are connected to the gate of the FET Q by the operation of the switches.

Next, the current detection circuitry 102 judges whether the predetermined current is detected (S104). This state is kept until the current detection circuitry 102 detects the predetermined current (S104: NO). When the current detection circuitry 102 detects the predetermined current, the process proceeds to the next process (S104: YES).

When the current detection circuitry 102 detects the predetermined current, that is, detects that the predetermined drain current flows through the FET Q, the enable signal is transmitted from the current detection circuitry 102 to the converter Adc of the control circuitry 104. When the enable signal is received, the converter Adc accepts the gate-source voltage of the FET Q at that timing being the analog signal amplified by the differential amplifier circuitry Amp (S106). The converter Adc converts this analog signal into the digital signal (S108).

Next, the decoder Dec of the control circuitry 104 acquires the impedance where the input signal is converted into the gate-source voltage at the timing based on the digital signal which is converted by the converter Adc (S110).

Next, the decoder Dec of the control circuitry 104 controls the impedance of the voltage application circuitry 100 to the acquired value (S112). For example, it is enabled by controlling the resistance value of the variable resistor in the voltage application circuitry 100.

After the impedance of the voltage application circuitry 100 is controlled, the first switch Sw1 and the second switch Sw2 are turned into the off-state (S114). These switches may be turned off in accordance with states at the inside and outside of the driver circuitry 10 as same as the S102 step, or may be turned off after a predetermined time has passed since the switches are turned on.

After the control of the impedance is completed, the driver circuitry 10 starts operation (S116), the input signal is applied to the gate of the power MOSFET, and it becomes possible to operate the electronic circuitry 1 as a switching element.

As mentioned above, according to this embodiment, the driver circuitry 10 controls the through rate of the voltage application circuitry 100 which applies the voltage to the gate of the FET Q by the control circuitry 104. The driver circuitry 10 can be designed as a simple circuitry because a constant current source and a constant voltage source are sufficient as the current source and the voltage source used for the driver circuitry 10, and variable ones are not necessarily provided. The rising times and the falling times between the MOSFETs having different threshold voltages can be controlled by controlling the through rates. When a plurality of MOSFETs are provided in parallel, unbalance in the drain currents output from respective MOSFETs can be suppressed by connecting the driver circuitry 10 to the gate of each of the MOSFETs.

As illustrated in FIG. 2, the driver circuitry 10 may include the MCU 106 (micro controller unit) or the like including a storage circuitry. The MCU 106 may be included one or plural with respect to a plurality of driver circuitries 10. When a plurality of MCUs 106 exist, impedance values may be synchronized among the plurality of MCUs 106. A control signal (an input signal "input") which is applied from the MCU 106 to the gate may be input.

The control circuitry 104 transmits, for example, an impedance value acquired at the driver circuitry 10 to the MCU 106. The storage circuitry in the MCU 106 stores this value. By storing the value, the impedance of the voltage application circuitry 100 may be controlled based on the impedance value stored in the MCU 106 after the power is once turned off.

When the impedance is measured every time when the power is applied, it is also possible to check deterioration over time of the FET Q by, for example, checking the impedance values stored in the MCU 106 in chronological order.

In the above explanation, the driver circuitry 10 is once operated at the operation start time of the electronic circuitry 1 to control the impedance, but it is not limited thereto. For example, when a control value of the impedance is stored in the MCU 106, the control circuitry 104 may control the impedance of the voltage application circuitry 100 without turning on the first switch Sw1 and the second switch Sw2 even at the operation start time.

As another example, the input signal may be shut out at an arbitrary timing, the first switch Sw1 and the second switch Sw2 are turned on, and measurement of the impedance value may be performed again at the driver circuitry 10. It is thereby possible to watch the impedance value while devices of the electronic circuitry 1 are in operation.

The FET Q is set to be an n-channel FET, but it is not limited thereto, and a p-channel FET may be used according to usages or the like of the electronic circuitry 1.

In the above-mentioned all of the explanations, expressions of "or more", "or less" are used, but these expressions may be rewritten into "larger than", "smaller than".

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A driver circuitry comprising:
    a voltage application circuitry which is connected to a drive terminal of a transistor, and controls a voltage of an input signal and applies to the drive terminal;
    a current detection circuitry which is connected to an output terminal of the transistor, and detects that a current output from the transistor becomes a size of a predetermined current or more;
    a control circuitry which is connected to the current detection circuitry, and controls the voltage application circuitry based on the voltage of the input signal to output a voltage between the drive terminal and the output terminal at a timing when the current detection circuitry detects the current of the predetermined current or more;
    a current source which outputs a current;
    a first switch which is connected to the drive terminal and the current source, and switches a connection state between the current source and the drive terminal;
    a second switch which is connected to the drive terminal, and switches a connection state with the drive terminal while being synchronized with the first switch; and
    a differential amplifier circuitry whose input side is connected to the output terminal through the second switch, and to the current source through the first switch and the second switch, and whose output side is connected to the control circuitry, and which outputs a potential difference between an electric potential at the current source and an electric potential at the output terminal to the control circuitry, wherein:
    the control circuitry acquires the voltage between the drive terminal and the output terminal based on the potential difference output by the differential amplifier circuitry.

2. The driver circuitry according to claim 1, wherein:
    the control circuitry controls an output impedance of the voltage application circuitry and controls the voltage output by the voltage application circuitry.

3. The driver circuitry according to claim 2, wherein:
    the voltage application circuitry includes a variable resistor; and
    the control circuitry controls a resistance value of the variable resistor.

4. The driver circuitry according to claim 1, wherein:
    the voltage application circuitry is initialized to control the input signal to be a predetermined voltage;
    when the voltage between the drive terminal and the output terminal is lower than the predetermined voltage, the control circuitry controls the resistance value of the voltage application circuitry to be high; and
    when the voltage between the drive terminal and the output terminal is higher than the predetermined voltage, the control circuitry controls the resistance value of the voltage application circuitry to be low.

5. The driver circuitry according to claim 1, wherein:
    the first switch and the second switch are switched at an arbitrary timing after power is turned on such that the current source and the drive terminal, and the current source and the differential amplifier circuitry are connected in order that the control circuitry controls the voltage application circuitry, and subsequently, the first switch and the second switch are switched to disconnect the current source and the drive terminal.

6. The driver circuitry according to claim 5, wherein:
    at the power-on timing, the first switch and the second switch are switched to connect the current source and the drive terminal and the control circuitry controls the voltage application circuitry, and subsequently, the first switch and the second switch are switched to disconnect the current source and the drive terminal.

7. The driver circuitry according to claim 1, further comprising:
    a storage circuitry which stores a control value when the control circuitry controls the voltage application circuitry; wherein:
    the voltage application circuitry is controlled based on the control value stored at an arbitrary timing.

8. A semiconductor device, comprising:
    a plurality of the transistor having drains which are connected to each other and sources which are connected to each other; and
    the driver circuitries according to claim 1 configured to drive the plurality of the transistor, respectively.

* * * * *